(12) United States Patent
Hong et al.

(10) Patent No.: US 9,147,787 B2
(45) Date of Patent: Sep. 29, 2015

(54) SOLAR CELL PANEL

(75) Inventors: Jongkyoung Hong, Seoul (KR); Jemin Yu, Seoul (KR); Jongdae Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 5 days.

(21) Appl. No.: 13/182,337

(22) Filed: Jul. 13, 2011

(65) Prior Publication Data

US 2011/0265849 A1 Nov. 3, 2011

(30) Foreign Application Priority Data

Jan. 27, 2011 (KR) .................. 10-2011-0008333

(51) Int. Cl.
*H01L 31/00* (2006.01)
*H01L 31/05* (2014.01)

(52) U.S. Cl.
CPC ........ *H01L 31/0504* (2013.01); *H01L 31/0512* (2013.01); *Y02E 10/50* (2013.01)

(58) Field of Classification Search
CPC ............. H01L 31/0224; H01L 31/022425; H01L 31/022433; H01L 31/042; H01L 31/05; H01L 31/0504; H01L 31/0508
USPC ................................... 136/244, 252
See application file for complete search history.

(56) References Cited

U.S. PATENT DOCUMENTS

| | | | | |
|---|---|---|---|---|
| 5,034,068 A * | 7/1991 | Glenn et al. | .................. | 136/256 |
| 6,858,461 B2 * | 2/2005 | Oswald et al. | .................. | 438/68 |
| 2006/0255340 A1 * | 11/2006 | Manivannan et al. | .......... | 257/79 |
| 2007/0235077 A1 * | 10/2007 | Nagata et al. | .................. | 136/256 |
| 2007/0295381 A1 | 12/2007 | Fujii et al. | | |
| 2008/0121265 A1 * | 5/2008 | Hishida et al. | ................ | 136/244 |
| 2009/0266402 A1 * | 10/2009 | Taira | .............................. | 136/244 |
| 2010/0116314 A1 | 5/2010 | Fukushima et al. | | |
| 2010/0126551 A1 | 5/2010 | Okamoto et al. | | |
| 2010/0201349 A1 * | 8/2010 | Taira et al. | ..................... | 324/149 |
| 2011/0011454 A1 * | 1/2011 | Taira | ............................. | 136/256 |

FOREIGN PATENT DOCUMENTS

JP 08008452 A * 1/1996
WO WO 2009099179 A1 * 8/2009

OTHER PUBLICATIONS

Schwertheim et al., Photovoltaic Specialists Conference, 2008. 33rd IEEE.*
Unknown, Panacol product guide, 2011.*

* cited by examiner

*Primary Examiner* — Eli Mekhlin
(74) *Attorney, Agent, or Firm* — Birch, Stewart, Kolasch & Birch, LLP

(57) ABSTRACT

A solar cell panel is discussed. The solar cell panel includes a plurality of solar cells each including a substrate, an emitter layer positioned at a light receiving surface of the substrate, and a plurality of front electrodes that are electrically connected to the emitter layer and extend parallel to one another in a first direction, an interconnector that electrically connects adjacent ones of the solar cells to each other and is positioned in a second direction crossing the front electrodes, a conductive adhesive film that is positioned between the front electrodes and the interconnector in the second direction and electrically connects the front electrodes to the interconnector, and an alignment mark indicating a bonding location of the conductive adhesive film, and positioned on the substrate.

15 Claims, 9 Drawing Sheets

SOLAR CELL PANEL

This application claims priority to and the benefit of Korean Patent Application No. 10-2011-0008333 filed in the Korean Intellectual Property Office on Jan. 27, 2011, the entire contents of which are incorporated herein by reference.

BACKGROUND OF THE INVENTION

1. Field of the Invention

Embodiments of the invention relate to a solar cell panel in which adjacent solar cells are electrically connected to one another using an interconnector.

2. Description of the Related Art

Solar power generation to convert light energy into electric energy using a photoelectric conversion effect has been widely used as a method for obtaining eco-friendly energy. A solar power generation system using a plurality of solar cell panels has been installed in places, such as houses due to an improvement in photoelectric conversion efficiency of solar cells.

The solar cell panel includes an interconnector for electrically connecting a plurality of solar cells to one another, front and back protective members for protecting the solar cells, and a sealing member that is positioned between the front and back protective members to seal the solar cells.

SUMMARY OF THE INVENTION

In one aspect, there is a solar cell panel including a plurality of solar cells, each solar cell including a substrate, an emitter layer that is positioned at a light receiving surface of the substrate and forms a p-n junction along with the substrate, and a plurality of front electrodes that are electrically connected to the emitter layer and extend parallel to one another in a first direction, an interconnector configured to electrically connect adjacent ones of the plurality of solar cells to each other, the interconnector being positioned in a second direction crossing the plurality of front electrodes, a conductive adhesive film including a resin and a plurality of conductive particles dispersed in the resin, the conductive adhesive film being positioned between the plurality of front electrodes and the interconnector in the second direction to electrically connect the plurality of front electrodes to the interconnector, and an alignment mark for indicating a bonding location of the conductive adhesive film, and positioned on the substrate.

The alignment mark may be connected to at least one of the plurality of front electrodes. Alternatively, the alignment mark may be formed between adjacent ones of the plurality of front electrodes in a state where both ends of the alignment mark are separated from the adjacent front electrodes.

When the alignment mark is connected to the at least one front electrode, one end or both ends of the alignment mark may be connected to the at least one front electrode.

The alignment mark may connect at least two of the plurality of front electrodes to each other. In this instance, the alignment mark may be formed on some or all of a plurality of rows of the front electrodes.

The alignment mark may be formed of the same material as the front electrodes and may be formed in the second direction.

The alignment mark having the above-described configuration may indicate a region in which one side of the conductive adhesive film is positioned.

A pair of alignment marks may be formed with respect to the conductive adhesive film. A distance between the pair of alignment marks may be equal to or less than a width of the conductive adhesive film.

Each of the plurality of solar cells may further include an anti-reflection layer positioned on the emitter layer on which the front electrodes are not positioned. A portion of the conductive adhesive film may directly contact the anti-reflection layer.

According to the above-described configuration, an alignment error between the solar cells and the interconnector during a tabbing process using the conductive adhesive film may be minimized.

Further, because a front electrode current collector for transferring carriers moving to the front electrodes to the interconnector is not necessary, the process and the cost required to form the front electrode current collector may be reduced.

When the front electrodes are directly connected to the interconnector using the conductive adhesive film, the tabbing process may be performed at a low temperature, for example, at a temperature equal to or lower than 180° C. As discussed above, when the tabbing process is performed at the low temperature, a bowing phenomenon and a damage of the substrate may be prevented or reduced more sufficiently or readily as compared to when the tabbing process is performed using a soldering at a high temperature, for example, at a temperature equal to or higher than 220° C.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
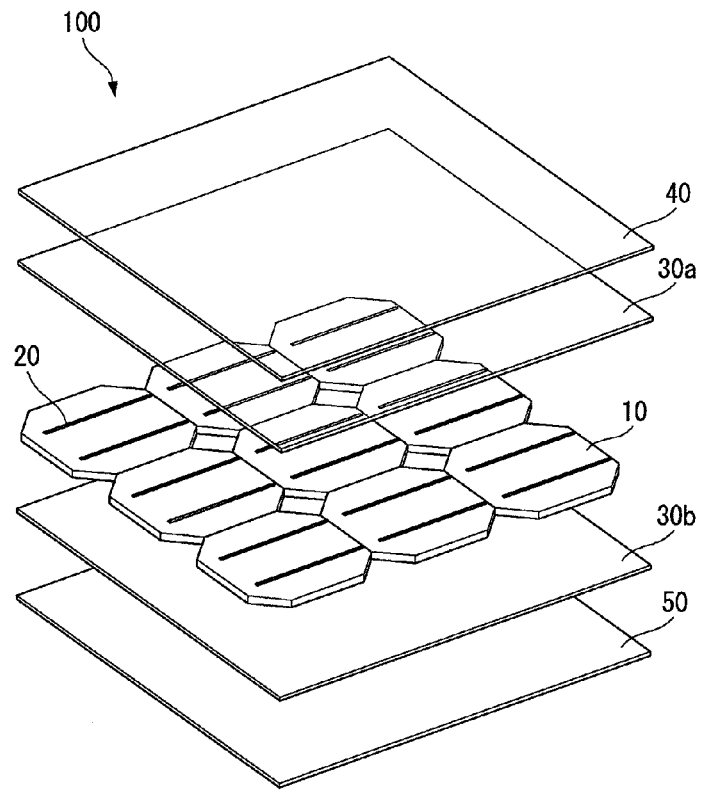
FIG. 1 is an exploded perspective view of a solar cell panel according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 is an exploded perspective view of a solar cell panel according to an example embodiment of the invention. As shown in FIG. 1, a solar cell panel 100 according to an example embodiment of the invention includes a plurality of solar cells 10, interconnectors 20 for electrically connecting the solar cells 10 to one another, front and back protective layers 30a and 30b for protecting the solar cells 10, a transparent member 40 positioned on the front protective layer 30a on light receiving surfaces of the solar cells 10, and a back sheet 50 underlying the back protective layer 30b on surfaces opposite the light receiving surfaces of the solar cells 10.

The back sheet 50 prevents moisture or oxygen from penetrating into a back surface of the solar cell panel 100, thereby protecting the solar cells 10 from an external environment. The back sheet 50 may have a multi-layered structure including a moisture/oxygen penetrating prevention layer, a chemical corrosion prevention layer, a layer having insulating characteristics, etc.

In a double-sided light receiving solar cell, a transparent sheet such as a glass substrate or a resin substrate having a light transparency may be used instead of the back sheet 50.

The front and back protective layers 30a and 30b and the solar cells 10 form an integral body when a lamination process is performed in a state where the front and back protective layers 30a and 30b are respectively positioned on front surfaces and back surfaces of the solar cells 10. The front and back protective layers 30a and 30b prevent corrosion of metal resulting from the moisture penetration and protect the solar cells 10 from an impact. The front and back protective layers 30a and 30b may be formed of a material such as ethylene vinyl acetate (EVA). Other materials may be used for the front and back protective layers 30a and 30b.

The transparent member 40 on the front protective layer 30a may be formed of a tempered glass having a high light transmittance and excellent damage prevention characteristic. The tempered glass may be a low iron tempered glass containing a small amount of iron. The transparent member 40 may have an embossed inner surface so as to increase a scattering effect of light. Other materials may be used for the transparent member 40.

As shown in FIG. 1, the plurality of solar cells 10 is arranged in a matrix structure. The number of solar cells 10 arranged on the back protective layer 30b in row and/or column directions may vary, if necessary or desired.

Figure 2:
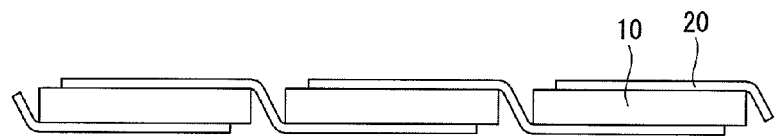
FIG. 2 schematically illustrates an electrical connection structure between a plurality of solar cells of the solar cell panel shown in FIG. 1.

As shown in FIG. 2, the plurality of solar cells 10 are electrically connected to one another using the interconnectors 20. More specifically, an electrode part formed on a front surface of one solar cell 10 is electrically connected to an electrode part formed on a back surface of another solar cell 10 adjacent to the one solar cell 10 using an interconnector 20 in a state where the plurality of solar cells 10 are positioned adjacently to one another.

Figure 3:
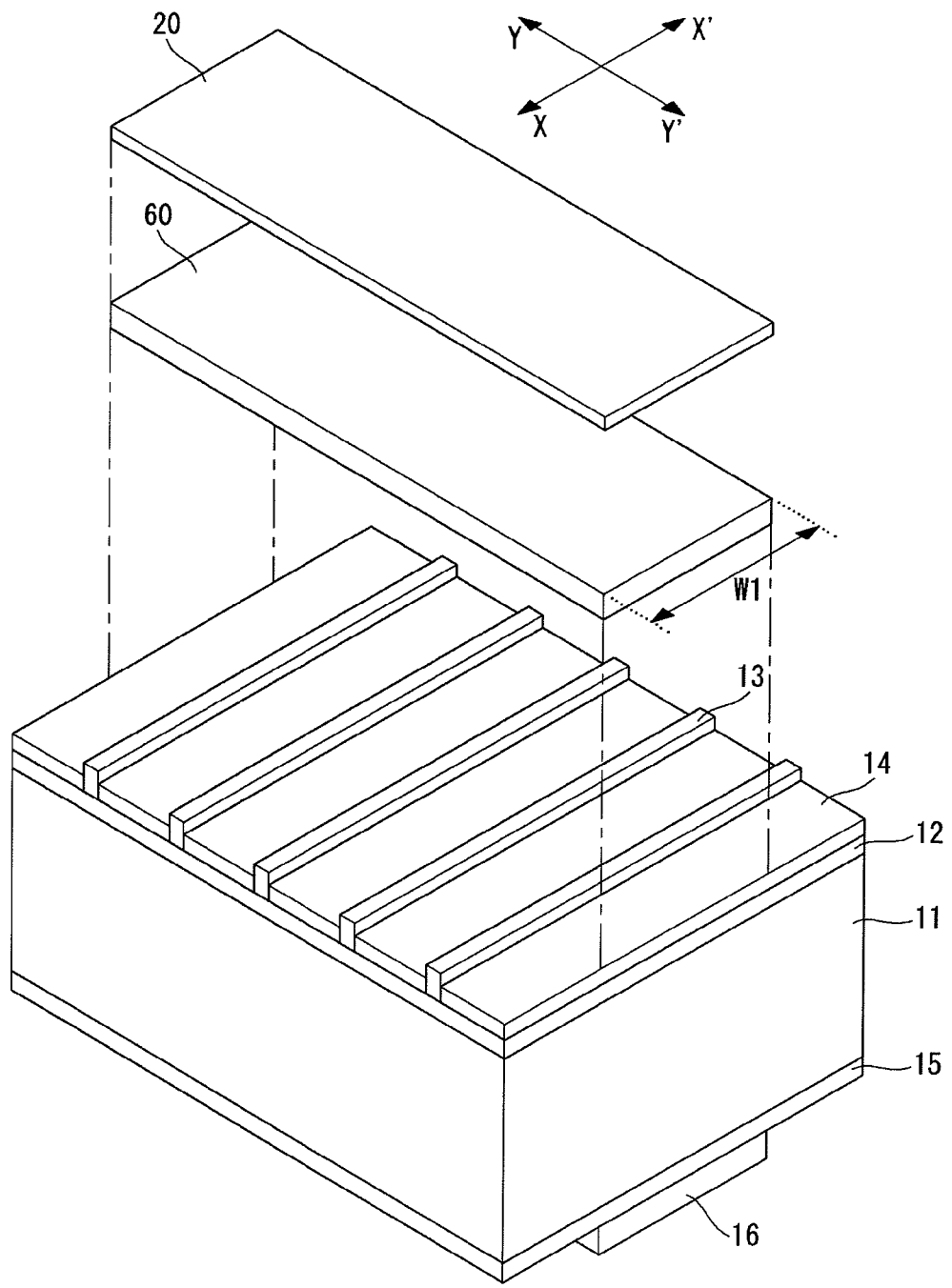
FIG. 3 is an exploded perspective view illustrating a configuration of a solar cell in the solar cell panel shown in FIG. 1.
Figure 4:
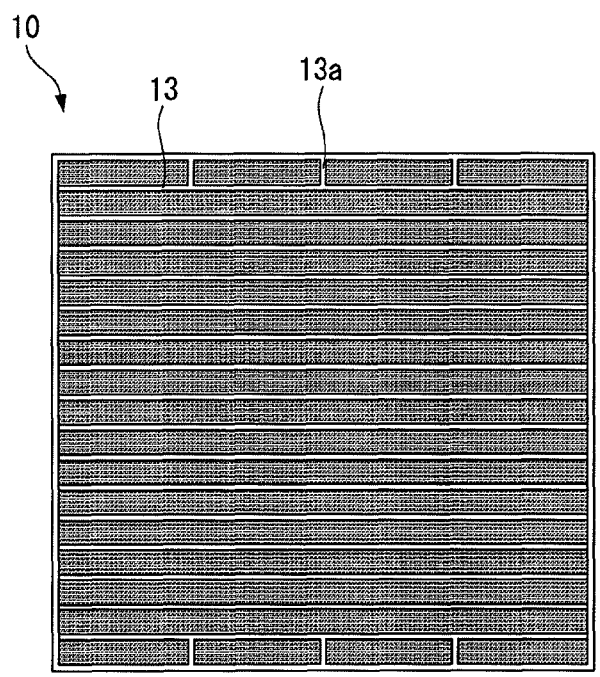
FIGS. 4 to 9 are plane views of a solar cell including an alignment mark having various configurations according to an embodiment of the invention.
Figure 9:
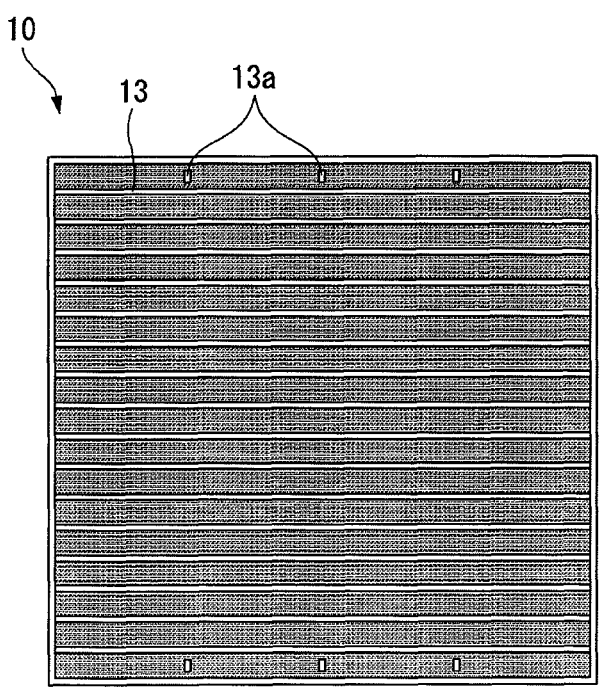
Figure 10:
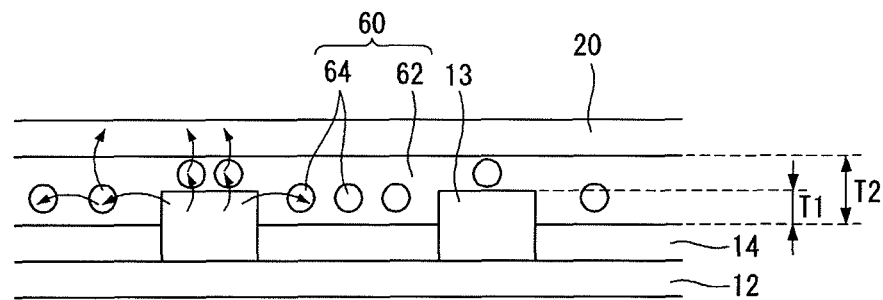
FIG. 10 is a cross-sectional view illustrating an assembly configuration of a solar cell in the solar cell panel shown in FIG. 3.
Figure 11:
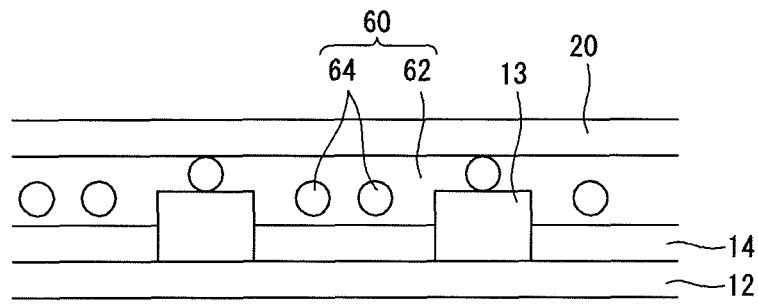
FIG. 11 is a cross-sectional view illustrating another assembly configuration of a solar cell in the solar cell panel shown in FIG. 3.

FIG. 3 is an exploded perspective view illustrating a configuration of a solar cell in the solar cell panel shown in FIG. 1. FIGS. 4 to 9 are plane views of a solar cell including an alignment mark having various configurations. FIG. 10 is a cross-sectional view illustrating an assembly configuration of a solar cell in the solar cell panel shown in FIG. 3. FIG. 11 is a cross-sectional view illustrating another assembly configuration of a solar cell in the solar cell panel shown in FIG. 3.

As shown in FIG. 3, the solar cell 10 includes a substrate 11, an emitter layer 12 positioned at a light receiving surface, on which light is incident, (for example, a front surface) of the substrate 11, a plurality of front electrodes 13 positioned on the emitter layer 12, an anti-reflection layer 14 positioned on the emitter layer 12 on which the plurality of front electrodes 13 are not positioned, a back electrode 15 positioned on a surface (for example, a back surface) opposite the light receiving surface of the substrate 11, and a plurality of back electrode current collectors 16 positioned on a back surface of the back electrode 15.

The solar cell 10 may further include a back surface field (BSF) layer between the back electrode 15 and the substrate 11. The back surface field layer may be a region (for example, a $p^+$-type region) that is more heavily doped with impurities of the same conductive type as the substrate 11 than the substrate 11. The back surface field layer may serve as a potential barrier of the substrate 11. Thus, because the back surface field layer may prevent or reduce a recombination and/or a disappearance of electrons and holes around the back surface of the substrate 11, the efficiency of the solar cell 10 may be improved.

The substrate 11 is a semiconductor substrate, which may be formed of first conductive type silicon, for example, p-type silicon, though not required. Silicon used in the substrate 11 may be single crystal silicon, polycrystalline silicon, or amorphous silicon. When the substrate 11 is of a p-type, the substrate 11 contains impurities of a group III element such as boron (B), gallium (Ga), and indium (In).

The surface of the substrate 11 may be textured to form a textured surface corresponding to an uneven surface or having uneven characteristics having a plurality of uneven portions. When the surface of the substrate 11 is the textured surface, a light reflectance in the light receiving surface of the substrate 11 is reduced. Further, because both a light incident operation and a light reflection operation are performed on the textured surface of the substrate 11, light is confined in the solar cell 10. Hence, light absorption increases, and the efficiency of the solar cell 10 is improved. In addition, because a reflection loss of light incident on the substrate 11 decreases, an amount of light incident on the substrate 11 further increases.

The emitter layer 12 is a region doped with impurities of a second conductive type (for example, an n-type) opposite the first conductive type of the substrate 11. The emitter layer 12 forms a p-n junction along with the substrate 11. When the emitter layer 12 is to be of the n-type, the emitter layer 12 may be formed by doping the substrate 11 with impurities of a group V element such as phosphor (P), arsenic (As), and antimony (Sb).

When energy of light incident on the substrate 11 is applied to the semiconductors of the substrate 11, carriers (for example, electron-hole pairs) are produced inside the semiconductors, and electrons move to the n-type semiconductor and holes move to the p-type semiconductor. Thus, when the substrate 11 is of the p-type and the emitter layer 12 is of the n-type, the holes move to the p-type substrate 11 and the electrons move to the n-type emitter layer 12.

Alternatively, the substrate 11 may be of an n-type and/or may be formed of semiconductor materials other than silicon. When the substrate 11 is of the n-type, the substrate 11 may contain impurities of a group V element such as phosphorus (P), arsenic (As), and antimony (Sb).

Because the emitter layer 12 forms the p-n junction along with the substrate 11, the emitter layer 12 is of the p-type when the substrate 11 is of the n-type. In this instance, electrons move to the n-type substrate 11 and holes move to the p-type emitter layer 12.

When the emitter layer 12 is of the p-type, the emitter layer 12 may be formed by doping a portion of the substrate 11 with impurities of a group III element such as boron (B), gallium (Ga), and indium (In).

The anti-reflection layer 14 on the emitter layer 12 may be formed of silicon nitride (SiNx), silicon dioxide ($SiO_2$), or titanium dioxide ($TiO_2$). The anti-reflection layer 14 reduces a reflectance of light incident on the solar cell 10 and increases a selectivity of a predetermined wavelength band of the incident light, thereby increasing the efficiency of the solar cell 10. The anti-reflection layer 14 may have a thickness of about 70 nm to 80 nm. The anti-reflection layer 14 may be omitted, if desired.

The plurality of front electrodes 13 on the emitter layer 12 are electrically and physically connected to the emitter layer 12 and are formed in one direction, for example, a first direction X-X' in a state where the adjacent front electrodes 13 are spaced apart from one another. Each of the front electrodes 13 collects carriers (e.g., electrons) moving to the emitter layer 12. Each of the front electrodes 13 is formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used for the front electrodes 13.

For example, the front electrodes 13 may be formed of a conductive paste containing a glass frit and a silver (Ag) powder which are mixed with each other.

In this instance, the front electrodes 13 may be electrically connected to the emitter layer 12 by way of a process in which the conductive paste is coated on the anti-reflection layer 14 using a screen printing method and the substrate 11 is fired at a temperature of about 750° C. to 800° C. The electrical connection between the front electrodes 13 and the emitter layer 12 is performed by bringing the Ag powder, which passes through the anti-reflection layer 14 using an etching component contained in the glass fit during the firing process, into contact with the emitter layer 12.

The back electrode 15 is formed on the surface (i.e., the back surface of the substrate 11) opposite the light receiving surface of the substrate 11. The back electrode 15 collects carriers (e.g., holes) moving to the substrate 11. The back electrode 15 is formed of at least one conductive material. The conductive material may be at least one selected from the group consisting of Ni, Cu, Ag, Al, Sn, Zn, In, Ti, Au, and a combination thereof. Other conductive materials may be used for the back electrode 15.

The plurality of back electrode current collectors 16 are positioned under the back electrode 15 in a direction crossing the front electrodes 13. The back electrode current collectors 16 are electrically connected to the back electrode 15. Thus, the back electrode current collectors 16 output carriers (e.g., holes) transferred from the back electrode 15 to an external device. The back electrode current collectors 16 are formed of at least one conductive material. The conductive material used for the back electrode current collectors 16 may be at least one selected from the group consisting of Ni, Cu, Ag, Al, Sn, Zn, In, Ti, Au, and a combination thereof. Other conductive materials may be used.

The back electrode current collectors 16 may contact the back surface of the substrate 11. In this instance, the back electrode 15 may be formed on a remaining back surface except the back surface of the substrate 11 on which the back electrode current collectors 16 are positioned.

As shown in FIG. 2, the solar cells 10 each having the above-described configuration are electrically connected to one another using the interconnectors 20.

More specifically, a conductive adhesive film 60 is positioned on the emitter layer 12 in a second direction Y-Y' crossing the front electrodes 13.

FIG. 3 shows one conductive adhesive film 60. Additionally, two or three conductive adhesive films 60 may be positioned on the front surface of the substrate 11.

The conductive adhesive film 60 includes a resin 62 and conductive particles 64 dispersed in the resin 62 (see FIG. 10, for example). A material of the resin 62 is not particularly limited as long as it has the adhesive property. It is preferable, but not required, that a thermosetting resin is used for the resin 62 so as to increase an adhesive reliability. The thermosetting resin may use at least one selected among epoxy resin, phenoxy resin, acryl resin, polyimide resin, and polycarbonate resin. Other resins, which may not necessarily be thermosetting, may also be used.

The resin 62 may further contain a predetermined material, for example, a curing agent and a curing accelerator other than the thermosetting resin. For example, the resin 62 may contain a reforming material such as a silane-based coupling agent, a titanate-based coupling agent, and/or an aluminate-based coupling agent, so as to improve an adhesive strength between the front electrodes 13 and the interconnector 20. The resin 62 may contain a dispersant such as calcium phosphate and/or calcium carbonate, so as to improve the dispersibility of the conductive particles 64. The resin 62 may contain a rubber component such as acrylic rubber, silicon rubber, and/or urethane rubber, so as to control the modulus of elasticity of the resin 62.

A material of the conductive particles 64 is not particularly limited as long as it has the conductivity. The conductive particles 64 may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles 64 may be formed of only metal particles or metal-coated resin particles. The conductive adhesive film 60 having the above-described configuration may include a peeling film.

It is preferable, but not required, that the conductive particles 64 use the metal-coated resin particles, so as to mitigate a compressive stress of the conductive particles 64 and improve a connection reliability of the conductive particles 64. It is preferable, but not required, that the conductive particles 64 have a diameter of about 2 μm to 30 μm, so as to improve the dispersibility of the conductive particles 64. Conductive particles 64 of the same or different diameters may be used in the conductive adhesive films 60.

It is preferable, but not required, that a composition amount of the conductive particles 64 dispersed in the resin 62 is about 0.5% to 20% based on the total volume of the conductive adhesive film 60 in consideration of the connection reliability after the resin 62 is cured.

When the composition amount of the conductive particles 64 is less than about 0.5%, a current may not smoothly flow because a physical contact area between the conductive adhesive film 60 and the front electrodes 13 decreases. When the composition amount of the conductive particles 64 is greater than about 20%, the adhesive strength of the conductive adhesive film 60 may be reduced because a composition amount of the resin 62 relatively decreases.

The conductive adhesive film 60 is attached to a portion of each of the front electrodes 13 in the direction crossing the front electrodes 13. Thus, a portion of the conductive adhesive film 60 directly contacts a portion of each of the front electrodes 13, and a remaining portion of the conductive adhesive film 60 directly contacts the anti-reflection layer 14.

When a tabbing process is performed using the conductive adhesive film 60, a heating temperature and a pressure are not particularly limited as long as they are within the range capable of securing an electrical connection and maintaining the adhesive strength.

For example, the heating temperature may be set to a temperature capable of curing the resin 62, for example, about 150° C. to 180° C. The pressure may be set to a range capable of sufficiently attaching the front electrodes 13, the conductive adhesive film 60, and the interconnector 20 to one another. Further, a heating and pressure time may be set to the extent that the front electrodes 13, the interconnector 20, etc., are not damaged or deteriorated because of heat.

The interconnector 20 is attached to a front surface of the conductive adhesive film 60, that is attached to the front electrodes 13 and the anti-reflection layer 14 in the second direction Y-Y' crossing the front electrodes 13, in the same direction as a formation direction of the conductive adhesive film 60. A remaining portion of the interconnector 20, that is not attached to the conductive adhesive film 60, is attached to the back electrode current collectors 16 of another solar cell 10 adjacent to the above-described solar cell 10.

As shown in FIG. 10, the resin 62 may be positioned between the conductive particles 64 and the front electrodes 13, and between the conductive particles 64 and the interconnector 20 in a state where the front electrodes 13 are attached to the interconnector 20 using the conductive adhesive film 60.

In this instance, carriers moving to the front electrodes 13 jump to the conductive particles 64 and then again jump to the interconnector 20 as indicated by an arrow shown in FIG. 10. Further, carriers jumping to the conductive particles 64 may jump to the adjacent conductive particles 64 as indicated by the arrow shown in FIG. 10. In other words, the carriers moving to the front electrodes 13 move as indicated by the arrow shown in FIG. 10 and then move to the interconnector 20.

A distance between the conductive particles 64 may be properly set so that the carriers can jump between the adjacent conductive particles 64. The distance between the conductive particles 64 may be set by properly adjusting the number or the size of the conductive particles 64 dispersed in the resin 62.

Thus, the carriers moving to the front electrodes 13 are transferred to the interconnector 20 through the conductive particles 64.

Alternatively, as shown in FIG. 11, the conductive particles 64 may directly contact the front electrode 13, the interconnector 20, or both.

In the structure shown in FIG. 11, because the carriers moving to the front electrodes 13 are directly transferred to the interconnector 20 through the conductive particles 64, a current in the structure shown in FIG. 11 more smoothly flows than the structure shown in FIG. 10.

The conductive adhesive film 60 may have a thickness T2 greater than a protruding thickness T1 of the front electrode 13, so that the conductive adhesive film 60 and the interconnector 20 are sufficiently attached to each other. In this instance, because a front surface of the conductive adhesive film 60 is a flat surface, the conductive adhesive film 60 and the interconnector 20 are sufficiently attached to each other.

Because a thickness of the front electrode 13 is generally equal to or less than about 15 μm, the protruding thickness T1 of the front electrode 13 is less than about 15 μm. Thus, the thickness T2 of the conductive adhesive film 60 may be about 15 μm to 60 μm based on specifications of the solar cell to be used in the solar cell panel.

Figure 12:
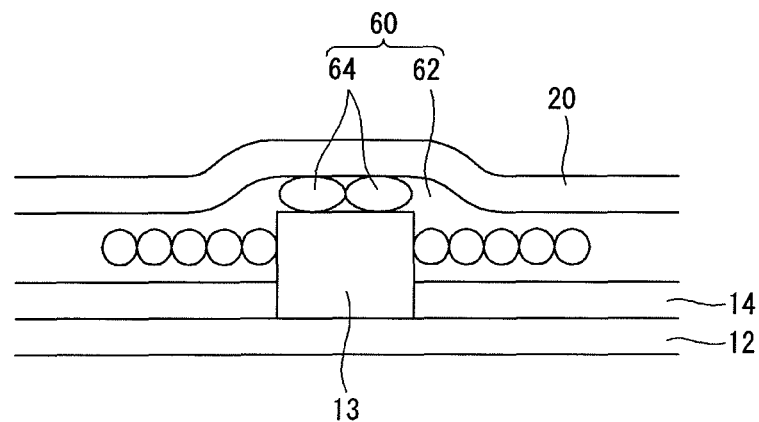
FIG. 12 is a cross-sectional view illustrating another assembly configuration of a solar cell in the solar cell panel shown in FIG. 3.

Further, as shown in FIG. 12, the conductive adhesive film 60 may have a height difference. The adjacent conductive particles 64 may physically contact one another, so that the carriers moving to the front electrodes 13 are sufficiently transferred to the interconnector 20. Further, at least two conductive particles 64 may be positioned on the front electrode 13.

When the conductive adhesive film 60 has the height difference, the interconnector 20 may have the same height difference as the conductive adhesive film 60. The interconnector 20 may have a portion, whose surface protrudes, because of the conductive particles 64.

As shown in FIG. 12, the conductive particles 64 may be modified into an oval shape because of pressure applied during the tabbing process. Thus, it is preferable, but not required, that a width W1 of the conductive adhesive film 60 is greater than the thickness T2 of the conductive adhesive film 60.

The tabbing process includes a pre-bonding process for preliminarily bonding the conductive adhesive film 60 to the solar cell and a final bonding process for finally bonding the conductive adhesive film 60 to the interconnector 20.

However, in the solar cell, in which the front electrodes 13 are formed and a front electrode current collector is removed, as in the embodiment of the invention, it is difficult to align the solar cell and the conductive adhesive film 60 during the tabbing process using a hot air or a laser.

Thus, the solar cell panel according to the embodiment of the invention includes a plurality of alignment marks 13a (see FIGS. 4-9) for preliminarily indicating a location to which the conductive adhesive film 60 will be bonded.

The alignment mark 13a may be formed of the same material as the front electrodes 13. In this instance, the alignment mark 13a may be formed through the same process as the front electrodes 13. In other words, when the conductive paste is printed to form a front electrode pattern, an alignment mark pattern may be simultaneously printed. In an embodiment of the invention, the alignment mark 13a may be formed to contact the emitter layer 12 by passing though the anti-reflection layer 14 positioned on the emitter layer 12. Accordingly, the anti-reflection layer 14 may not formed where the alignment mark 13a is formed.

Alternatively, the alignment mark 13a may be formed of a material different from the front electrodes 13. In another embodiment of the invention, the alignment mark 13a may be formed on the anti-reflection layer 14. Accordingly, the alignment mark 13a may be formed without contacting the emitter layer 12.

As shown in FIGS. 4 to 7, the alignment mark 13a may be connected to at least one of the plurality of front electrodes 13. When the alignment mark 13a is connected to at least one front electrode 13, one end of the alignment mark 13a may be connected to the at least one front electrodes 13. Further, both ends of the alignment mark 13a may be connected to adjacent ones of the plurality of front electrodes 13.

Figure 6:
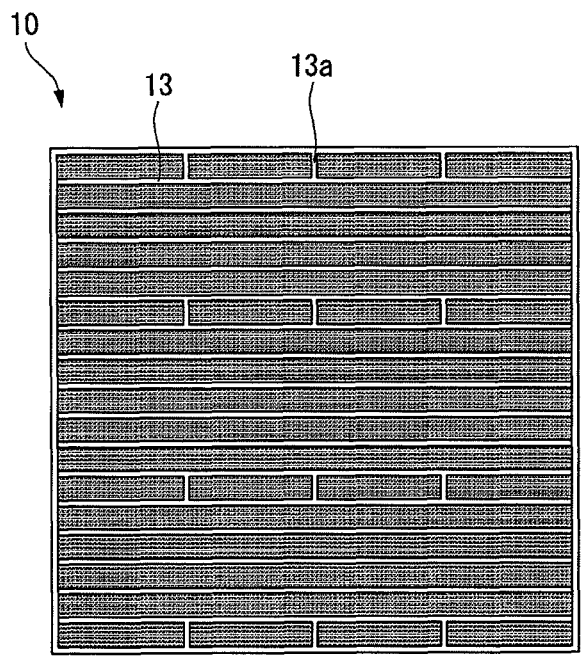
Figure 7:
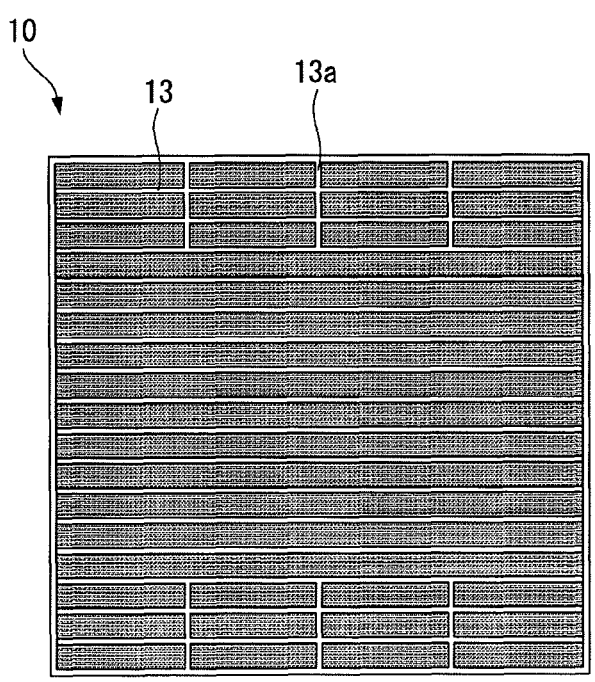

As shown in FIG. 7, the alignment mark 13a may connect at least two front electrodes 13 to each other. As shown in FIGS. 4 to 7, the alignment mark 13a may be formed on some of a plurality of rows of the front electrodes 13. Additionally, the alignment marks 13a may be formed on all of the rows of the front electrode 13.

FIGS. 4 to 7 show that the same number of alignment marks 13a as the number of conductive adhesive films 60 is formed with respect to one front electrode 13. In this instance, the alignment mark 13a may indicate a region in which one side of the conductive adhesive film 60 is positioned.

Figure 8:
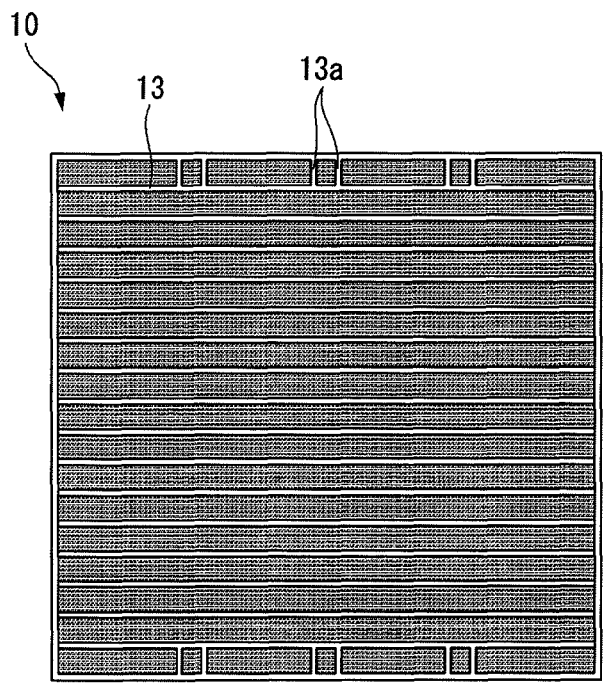

Alternatively, as shown in FIG. 8, the alignment marks 13a corresponding to two times the number of conductive adhesive films 60 may be formed with respect to one front electrode 13. In this instance, a pair of alignment marks 13a is spaced apart from each other at the same distance as the width of the conductive adhesive film 60. Further, the pair of alignment marks 13a may respectively indicate regions in which both sides of the conductive adhesive film 60 are positioned.

Alternatively, the distance between the pair of alignment marks 13a may be less than the width of the conductive adhesive film 60 and also may be equal to or less than about ½ of the width of the conductive adhesive film 60.

Figure 5:
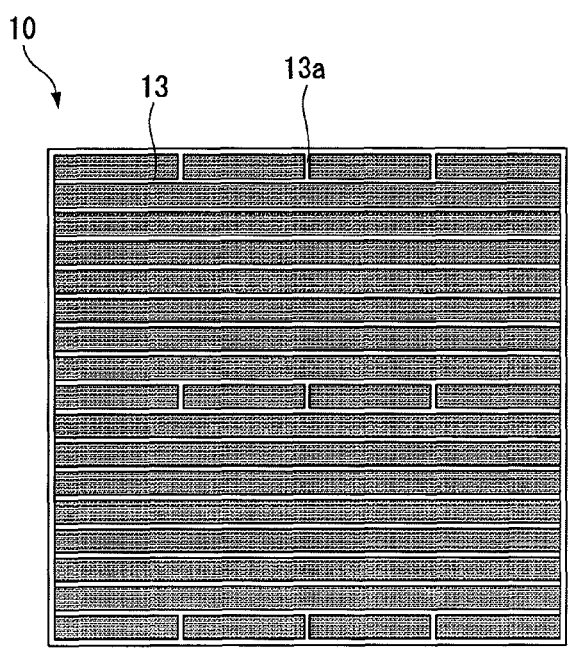

The alignment marks 13a shown in FIG. 8 may be variously arranged as in the alignment mark shown in FIGS. 5 to 7.

FIGS. 4 to 8 show the alignment mark 13a connected to at least one front electrode 13. Additionally, as shown in FIG. 9, the alignment mark 13a may be formed between the adjacent front electrodes 13 in a state where both ends of the alignment mark 13a are separated from the adjacent front electrodes 13.

FIGS. 4-9 show the alignment mark 13a extending in a direction that is perpendicular to the plurality of front electrodes 13, i.e., the first direction X-X'. In other embodiments of the invention, the alignment mark 13a may extend in a direction that is parallel to the plurality of front electrodes 13, i.e., the second direction Y-Y'. In yet another embodiment of the invention, the alignment mark 13a may extend in a direction that is different from the first and second directions.

When the conductive adhesive film 60 is attached to the solar cell 10 so that a portion of the conductive adhesive film 60 directly contacts a portion of each of the front electrodes 13, and a remaining portion of the conductive adhesive film 60 directly contacts the anti-reflection layer 14, one or more alignment marks 13a, or portions thereof, may be disposed between the conductive adhesive film 60 and the emitter layer 12. Alternatively, or concurrently, one or more alignment marks 13a, or portions thereof, may be disposed between the conductive adhesive film 60 and anti-reflection layer 14.

FIGS. 4-9 show the alignment mark 13a as having a bar shape. In other embodiments of the invention, the alignment mark 13a may have ring shape, a circle shape, a polygon shape, an oval shape, a star shape, or any other shape or form.

Figure 13:
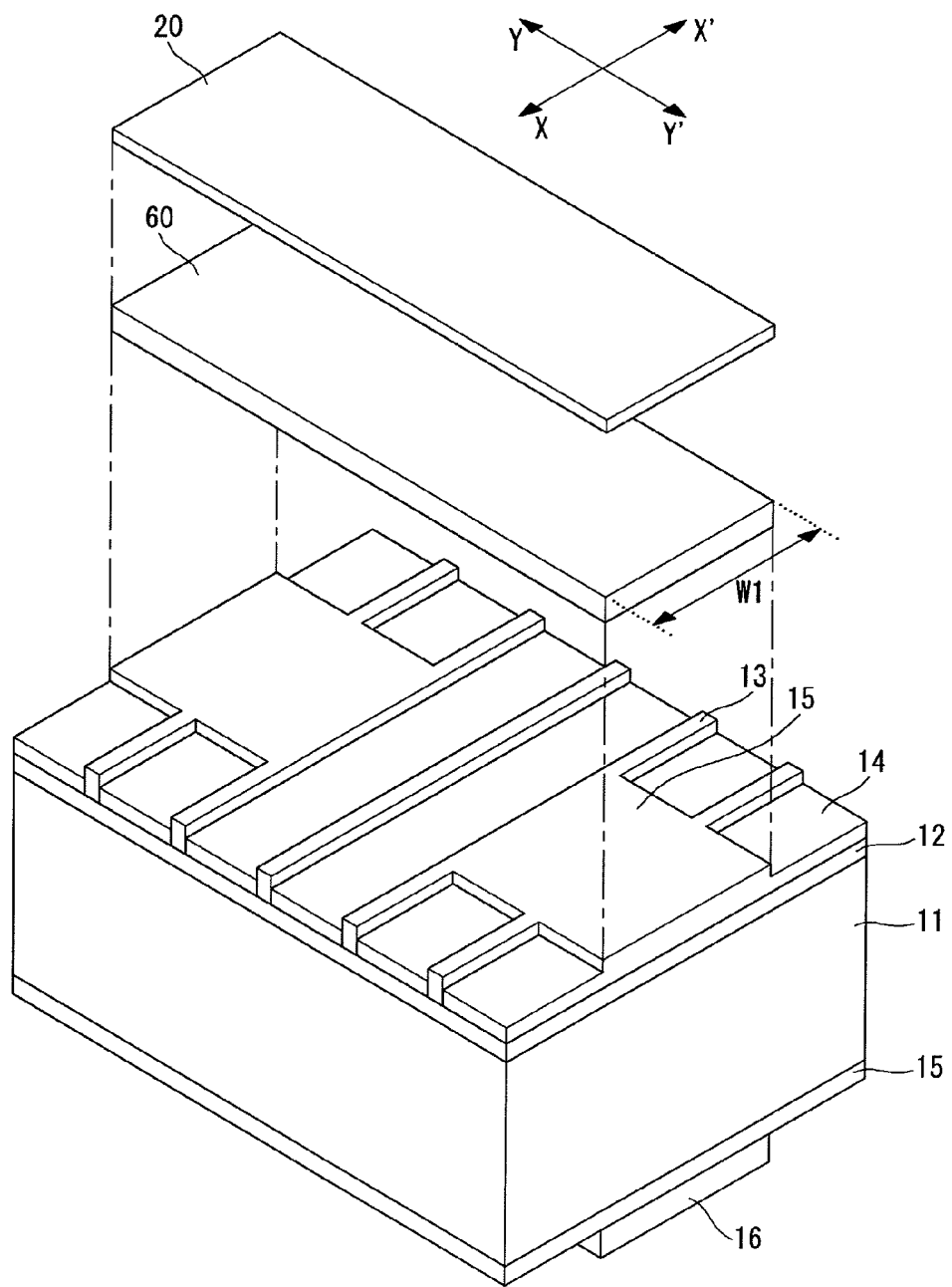
FIG. 13 is an exploded perspective view illustrating another configuration of a solar cell in the solar cell panel shown in FIG. 1.

FIG. 13 is an exploded perspective view illustrating another configuration of a solar cell in the solar cell panel shown in FIG. 1. The embodiment of the solar cell shown in FIG. 13 is similar to the embodiment of the solar cell shown in FIG. 1, except for having front electrode current collectors 15. The front electrode current collectors 15 are positioned on the emitter layer 12 in a direction crossing the plurality of front electrodes 13. The anti-reflection layer 14 is not formed where the front electrode current collectors 15 are positioned. Each front electrode current collector 15 may be connected to a plurality of front electrodes 13.

The front electrode current collectors 15 are electrically and physically connected to the emitter layer 12 and the front electrodes 13. Thus, the front electrode current collectors 15 output carriers (e.g., electrons) transferred from the front electrodes 13 to an external device. The front electrode current collectors 15 are formed of at least one conductive material. The conductive material used for the front electrode current collectors 15 may be at least one selected from the group consisting of Ni, Cu, Ag, Al, Sn, Zn, In, Ti, Au, and a combination thereof. Other conductive materials may be used.

In embodiments of the invention, each front electrode current collectors 15 need not be connected to all of the plurality of front electrodes 13. Instead, each front electrode current collectors 15 need only be connected to at least one front electrode 13, and preferably, but not necessarily, to several front electrodes 13. Additionally, each front electrode current collectors 15 need not be a single piece element. For example, along a particular line that crosses the plurality of front electrodes 13, two or more front electrode current collectors 15 may be aligned. In embodiments of the invention, one or more front electrode current collectors 15 may be aligned with one or more alignment marks 13a. Such alignment may be in the second direction Y-Y' crossing the front electrodes 13.

Figure 14:
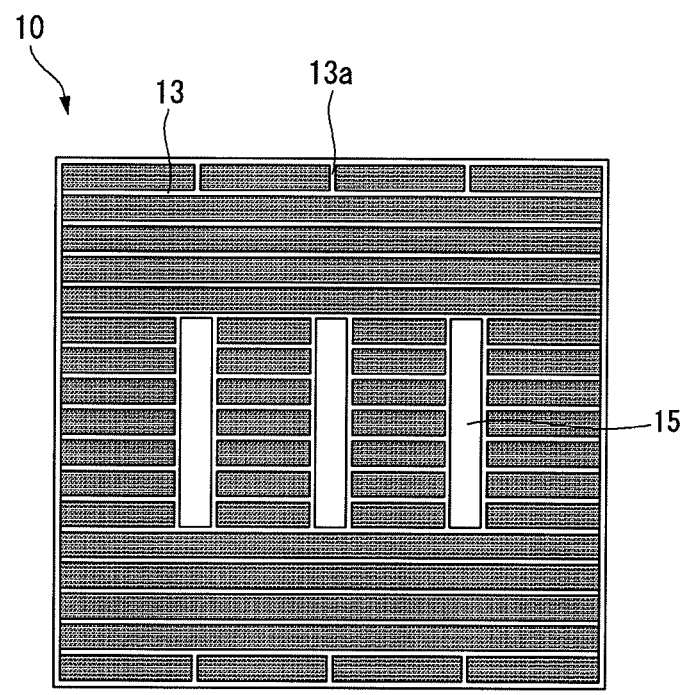
FIGS. 14 and 15 are plane views of a solar cell including an alignment mark having various configurations according to an embodiment of the invention.
Figure 15:
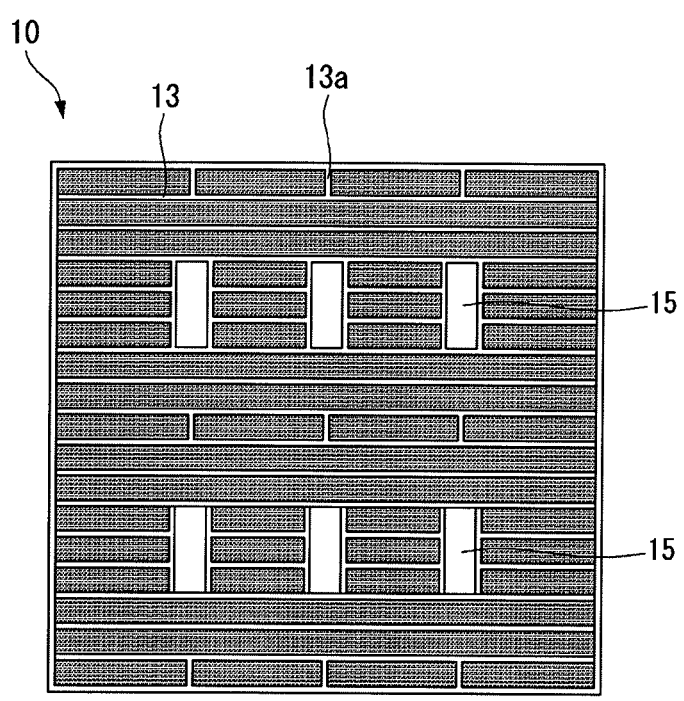

FIGS. 14 and 15 are plane views of a solar cell including an alignment mark having various configurations. As shown in FIGS. 14 and 15, one or more front electrode current collectors 15 may be aligned with one or more alignment marks 13a. For example, as shown in FIG. 14, each front electrode current collector 15 may be interposed between a pair of alignment marks 13a. Also, as shown in FIG. 15, an alignment mark 13a may be interposed between a pair of front electrode current collectors 15.

In an embodiment of the invention that includes one or more front electrode current collectors 15 and one or more alignment marks 13a, when the conductive adhesive film 60 is attached to the solar cell 10 so that a portion of the conductive adhesive film 60 directly contacts a portion of each of the front electrodes 13, and a remaining portion of the conductive adhesive film 60 directly contacts the anti-reflection layer 14, one or more alignment marks 13a and one or more front electrode current collectors 15, or portions thereof, may be disposed between the conductive adhesive film 60 and the emitter layer 12. Alternatively, or concurrently, one or more alignment marks 13a and one or more front electrode current collectors 15 may be aligned with one or more alignment marks 13a, or portions thereof, may be disposed between the conductive adhesive film 60 and anti-reflection layer 14. In embodiments of the invention, there may be direct contact between the one or more alignment marks 13a and the one or more front electrode current collectors 15, and the conductive adhesive film 60.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell panel comprising:

a plurality of solar cells, each solar cell including a substrate, an emitter layer that is positioned at a light receiving surface of the substrate and forms a p-n junction along with the substrate, a plurality of front electrodes electrically connected to the emitter layer and extending parallel to one another in a first direction, a plurality of front electrode current collectors electrically connected to the emitter layer in a second direction crossing the first direction, wherein each front electrode current collector intersects at least two of the plurality of front electrodes, and an alignment mark positioned on the emitter layer aligned with and spaced apart from the front electrode current collector and being electrically connected to the emitter layer;

an interconnector electrically connecting adjacent ones of the plurality of solar cells to each other, the interconnector being positioned in a second direction crossing the plurality of front electrodes; and a conductive adhesive film including a resin and a plurality of conductive particles dispersed in the resin, the conductive adhesive film being positioned between the plurality of front electrodes and the interconnector in the second direction, wherein the alignment mark is formed of the same material as the plurality of front electrodes, wherein a length of a front electrode current collector of the plurality of front electrode current collectors in the second direction is smaller than a distance between a first front electrode positioned at a first row of the plurality of front electrodes and a last front electrode positioned at a last row of the plurality of front electrodes, wherein the conductive adhesive film directly contacts the plurality of front electrodes, the alignment mark and at least one front electrode current collector of the plurality of front electrode current collectors along the second direction, and wherein the alignment mark is positioned between adjacent front electrode current collectors along the second direction.

2. The solar cell panel of claim 1, wherein the alignment mark is formed in the second direction.

3. The solar cell panel of claim 1, wherein the alignment mark is formed in the first direction.

4. The solar cell panel of claim 1, wherein the alignment mark indicates a region in which the at least one side of the conductive adhesive film is positioned.

5. The solar cell panel of claim 1, wherein a pair of alignment marks are formed with respect to the conductive adhesive film, and a distance between the pair of alignment marks is equal to or less than a width of the conductive adhesive film.

6. The solar cell panel of claim 1, wherein each solar cell further includes an anti-reflection layer positioned on the emitter layer on which the plurality of front electrodes are not positioned.

7. The solar cell panel of claim 6, wherein a portion of the conductive adhesive film directly contacts the anti-reflection layer.

8. The solar cell panel of claim 1, wherein the alignment mark is disposed between the conductive adhesive film and the emitter layer.

9. The solar cell panel of claim 1, wherein the alignment mark has a shape that includes one of a bar shape, a ring shape, a circle shape, a polygon shape and an oval shape.

10. The solar cell panel of claim 1, wherein the alignment mark has a bar shape and is connected to at least one of the plurality of front electrodes.

11. The solar cell panel of claim 10, wherein one end of the alignment mark is connected to at least one of the plurality of front electrodes.

12. The solar cell panel of claim 10, wherein both ends of the alignment mark is connected to adjacent ones of the plurality of front electrodes.

13. The solar cell panel of claim 10, wherein the alignment mark connects at least two of the plurality of front electrodes to each other.

14. The solar cell panel of claim 1, wherein the alignment mark is formed between adjacent ones of the plurality of front electrodes, and both ends of the alignment mark are separated from the adjacent ones of the plurality of front electrodes.

15. The solar cell panel of claim 1, further comprising a plurality of alignment marks, wherein a front electrode current collector of the plurality of front electrode current collectors is positioned between adjacent alignment marks along the second direction.

* * * * *